US008480841B2

(12) United States Patent
Pervan et al.

(10) Patent No.: US 8,480,841 B2
(45) Date of Patent: Jul. 9, 2013

(54) POWDER OVERLAY

(75) Inventors: Darko Pervan, Viken (SE); Göran Ziegler, Viken (SE)

(73) Assignee: Ceralog Innovation Belgium BVBA, Brussels (BE)

( * ) Notice: Subject to any disclaimer, the term of this patent is extended or adjusted under 35 U.S.C. 154(b) by 72 days.

(21) Appl. No.: 13/084,955

(22) Filed: Apr. 12, 2011

(65) Prior Publication Data
US 2011/0247748 A1  Oct. 13, 2011

Related U.S. Application Data

(60) Provisional application No. 61/323,463, filed on Apr. 13, 2010.

(51) Int. Cl.
*B32B 27/02* (2006.01)
*B32B 27/10* (2006.01)
*B32B 29/04* (2006.01)

(52) U.S. Cl.
USPC ............ 156/279; 427/189; 427/195; 427/201

(58) Field of Classification Search
USPC ................ 156/279, 283, 307.1, 307.3, 307.4, 156/307.5, 307.7; 427/189–195, 201
See application file for complete search history.

(56) References Cited

U.S. PATENT DOCUMENTS

| 2,962,081 | A | 11/1960 | Dobry et al. |
| 3,032,820 | A | 5/1962 | Johnson |
| 3,135,643 | A | 6/1964 | Michl |
| 3,308,013 | A | 3/1967 | Bryant |
| 3,345,234 | A | 10/1967 | Jecker et al. |
| 3,426,730 | A | 2/1969 | Lawson et al. |
| 3,486,484 | A | 12/1969 | Bullough |
| 3,673,020 | A | 6/1972 | De Jaeger |
| 3,846,219 | A | 11/1974 | Kunz |
| 3,897,185 | A | 7/1975 | Beyer |
| 3,914,359 | A | 10/1975 | Bevan |
| 3,961,108 | A | 6/1976 | Rosner et al. |
| 4,052,739 | A | 10/1977 | Wada et al. |

(Continued)

FOREIGN PATENT DOCUMENTS

| AU | 80284/75 | 6/1975 |
| CH | 298894 A | 5/1954 |

(Continued)

OTHER PUBLICATIONS

Ziegler, Göran, et al., U.S. Appl. No. 13/444,604, entitled "A Powder Mix and Method for Producing a Building Panel," filed in the U. S. Patent and Trademark Office on Apr. 11, 2012.

(Continued)

*Primary Examiner* — Katarzyna Wyrozebski Lee
*Assistant Examiner* — Scott W Dodds
(74) *Attorney, Agent, or Firm* — Buchanan Ingersoll & Rooney P.C.

(57) ABSTRACT

A method is disclosed of manufacturing a transparent wear resistant surface layer (1). The method may include the steps of, applying a decorative material on a carrier, applying a dry powder layer comprising a mix of processed wood fibers, binder and wear resistant particles above the decorative layer, curing the mix to a decorative surface, including the transparent wear resistant layer, by applying heat and pressure on the mix. In a preferred embodiment the method includes the step of pressing the mix against an embossed matrix to create an embossed decorative surface with high wear resistance.

21 Claims, 1 Drawing Sheet

U.S. PATENT DOCUMENTS

| | | | |
|---|---|---|---|
| 4,093,766 A | 6/1978 | Scher et al. |
| 4,131,705 A | 12/1978 | Kubinsky |
| 4,313,857 A | 2/1982 | Blount |
| 4,337,290 A | 6/1982 | Kelly et al. |
| 4,430,375 A | 2/1984 | Scher et al. |
| 5,034,272 A | 7/1991 | Lindgren et al. |
| 5,246,765 A | 9/1993 | Lussi et al. |
| 5,258,216 A | 11/1993 | Von Bonin et al. |
| 5,422,170 A | 6/1995 | Iwata et al. |
| 5,543,193 A | 8/1996 | Tesch |
| 5,569,424 A | 10/1996 | Amour |
| 5,601,930 A | 2/1997 | Mehta et al. |
| 5,604,025 A | 2/1997 | Tesch |
| 5,855,832 A | 1/1999 | Clausi |
| 5,925,296 A | 7/1999 | Leese |
| 5,942,072 A | 8/1999 | McKinnon |
| 6,103,377 A | 8/2000 | Clausi |
| 6,468,645 B1 | 10/2002 | Clausi |
| 6,773,799 B1 | 8/2004 | Persson et al. |
| 6,803,110 B2 | 10/2004 | Drees et al. |
| 7,022,756 B2 | 4/2006 | Singer |
| 7,811,489 B2 | 10/2010 | Pervan et al. |
| 2001/0009309 A1 | 7/2001 | Taguchi et al. |
| 2002/0100231 A1 | 8/2002 | Miller |
| 2003/0056873 A1 | 3/2003 | Nakos et al. |
| 2004/0191547 A1 | 9/2004 | Oldorff |
| 2004/0202857 A1 | 10/2004 | Singer |
| 2004/0206036 A1 | 10/2004 | Pervan |
| 2004/0237436 A1 | 12/2004 | Zuber et al. |
| 2005/0079780 A1 | 4/2005 | Rowe et al. |
| 2005/0252130 A1 | 11/2005 | Martensson |
| 2006/0024465 A1 | 2/2006 | Briere |
| 2006/0032175 A1 | 2/2006 | Chen et al. |
| 2006/0070321 A1 | 4/2006 | Au |
| 2006/0145384 A1 | 7/2006 | Singer |
| 2006/0183853 A1 | 8/2006 | Sczepan |
| 2007/0166516 A1 | 7/2007 | Kim et al. |
| 2007/0184244 A1 | 8/2007 | Doehring |
| 2007/0207296 A1 | 9/2007 | Eisermann |
| 2007/0218260 A1 | 9/2007 | Miclo et al. |
| 2007/0224438 A1 | 9/2007 | Van Benthem et al. |
| 2008/0000417 A1 | 1/2008 | Pervan et al. |
| 2008/0032120 A1 | 2/2008 | Braun |
| 2008/0090032 A1 | 4/2008 | Perrin et al. |
| 2008/0263985 A1 | 10/2008 | Hasch et al. |
| 2009/0124704 A1 | 5/2009 | Jenkins |
| 2009/0155612 A1 | 6/2009 | Pervan et al. |
| 2009/0208646 A1 | 8/2009 | Kreuder et al. |
| 2010/0092731 A1 | 4/2010 | Pervan et al. |
| 2010/0223881 A1 | 9/2010 | Kalwa |
| 2010/0291397 A1 | 11/2010 | Pervan et al. |
| 2010/0300030 A1 | 12/2010 | Pervan et al. |
| 2010/0319282 A1 | 12/2010 | Ruland |
| 2010/0323187 A1 | 12/2010 | Kalwa |
| 2010/0330376 A1 | 12/2010 | Trksak |
| 2011/0175251 A1 | 7/2011 | Ziegler et al. |
| 2011/0177319 A1 | 7/2011 | Ziegler et al. |
| 2011/0177354 A1 | 7/2011 | Ziegler et al. |
| 2011/0189448 A1 | 8/2011 | Lindgren et al. |
| 2011/0250404 A1 | 10/2011 | Pervan et al. |
| 2011/0293823 A1 | 12/2011 | Bruderer et al. |
| 2011/0293906 A1 | 12/2011 | Jacobsson |

FOREIGN PATENT DOCUMENTS

| | | |
|---|---|---|
| CH | 298 894 | 8/1954 |
| DE | 1 815 312 A1 | 7/1969 |
| DE | 7148789 | 4/1972 |
| DE | 7148789 U | 4/1972 |
| DE | 29 39 828 A1 | 4/1981 |
| DE | 33 34 921 A1 | 4/1985 |
| DE | 42 36 266 A1 | 5/1993 |
| DE | 202 14 532 U1 | 2/2004 |
| DE | 103 31 657 A1 | 2/2005 |
| DE | 20 2004 003 061 U1 | 7/2005 |
| DE | 20 2006 007 797 U1 | 8/2006 |
| DE | 10 2005 046 264 A1 | 4/2007 |
| DE | 10 2006 024 593 A1 | 12/2007 |
| EP | 0 129 430 A2 | 12/1984 |
| EP | 0 129 430 B1 | 1/1990 |
| EP | 0 355 829 A2 | 2/1990 |
| EP | 0 592 013 A2 | 4/1994 |
| EP | 0 611 408 B1 | 9/1996 |
| EP | 0 744 477 A2 | 11/1996 |
| EP | 0 914 914 A2 | 5/1999 |
| EP | 0 744 477 B1 | 1/2000 |
| EP | 1 193 288 A1 | 4/2002 |
| EP | 1 209 199 A1 | 5/2002 |
| EP | 1 249 322 A1 | 10/2002 |
| EP | 1 454 763 A2 | 9/2004 |
| EP | 1 498 241 A2 | 1/2005 |
| EP | 1 507 664 A1 | 2/2005 |
| EP | 1 507 664 B1 | 2/2005 |
| EP | 1 584 378 A1 | 10/2005 |
| EP | 1 681 103 A2 | 7/2006 |
| EP | 1 690 603 A1 | 8/2006 |
| EP | 1 847 385 A1 | 10/2007 |
| EP | 1 985 464 A1 | 10/2008 |
| EP | 1 997 623 A1 | 12/2008 |
| EP | 2 025 484 A1 | 2/2009 |
| EP | 1 454 763 B1 | 8/2009 |
| EP | 2 226 201 A1 | 9/2010 |
| EP | 2 246 500 A2 | 11/2010 |
| EP | 2 264 259 A2 | 12/2010 |
| EP | 2 272 667 A1 | 1/2011 |
| EP | 2 272 668 A1 | 1/2011 |
| EP | 2 305 462 A1 | 4/2011 |
| EP | 1 847 385 B1 | 9/2011 |
| FR | 2 873 953 A1 | 2/2006 |
| GB | 984 170 A | 2/1965 |
| GB | 1090450 | 11/1967 |
| JP | 2-229002 A | 9/1990 |
| JP | 11-291203 A | 10/1999 |
| JP | 2001-287208 A | 10/2001 |
| JP | 2003-311717 A | 11/2003 |
| JP | 2003-311718 A | 11/2003 |
| JP | 2005-034815 A | 2/2005 |
| JP | 2005-074682 A | 3/2005 |
| JP | 2005-170016 A | 6/2005 |
| JP | 2005-219215 A | 8/2005 |
| JP | 3705482 B2 | 10/2005 |
| JP | 2005-307582 A | 11/2005 |
| JP | 2007-216692 A | 8/2007 |
| JP | 2007-268843 A | 10/2007 |
| JP | 2008-188826 A | 8/2008 |
| SE | 469 326 B | 6/1993 |
| WO | WO 92/06832 A1 | 4/1992 |
| WO | WO 94/00280 A1 | 1/1994 |
| WO | WO 95/06568 A1 | 3/1995 |
| WO | WO 00/22225 A1 | 4/2000 |
| WO | WO 01/48333 A1 | 7/2001 |
| WO | WO 01/64408 A1 | 9/2001 |
| WO | WO 01/92037 A2 | 12/2001 |
| WO | WO 02/42167 A2 | 5/2002 |
| WO | WO 03/078761 A1 | 9/2003 |
| WO | WO 03/095202 A1 | 11/2003 |
| WO | WO 2004/042168 A1 | 5/2004 |
| WO | WO 2005/054600 A1 | 6/2005 |
| WO | WO 2006/007413 A1 | 1/2006 |
| WO | WO 2006/013469 A1 | 2/2006 |
| WO | WO 2006/043893 A1 | 4/2006 |
| WO | WO 2007/059294 A2 | 5/2007 |
| WO | WO 2009/065768 A1 | 5/2009 |
| WO | WO 2009/065769 A2 | 5/2009 |
| WO | WO 2009/124704 A1 | 10/2009 |
| WO | WO 2010/094500 A1 | 8/2010 |

OTHER PUBLICATIONS

Persson, Hans, et al., U.S. Appl. No. 13/444,653, entitled "Powder Based Balancing Layer," filed in the U.S. Patent and Trademark Office on Apr. 11, 2012.

Ziegler, Göran, et al, U.S. Appl. No. 13/445,379, entitled "Method of Manufacturing a Layer," filed in the U. S. Patent and Trademark Office on Apr. 12, 2012.

Persson, Hans, et al., U.S. Appl. No. 13/469,799, entitled "Method of Producing a Powder Layer or a Granular Layer," filed in the U.S. Patent and Trademark Office on May 11, 2012.

Vetter, Georg, et al., U.S. Appl. No. 61/612,672, entitled "Method for Producing a Building Panel," filed in the U. S. Patent and Trademark Office on Mar. 19, 2012.

Engstrand, Ola (Contact)/Valinge Innovation, Technical Disclosure entitled "Fibre Based Panels With a Wear Resistance Surface," Nov. 17, 2008, IP.com No. IPCOM000176590D, IP.com PriorArtDatabase, 76 pages.

Engstrand, Ola (Contact)/Valinge Innovation, Technical Disclosure entitled "WFF Embossing," May 15, 2009, IP.com No. IPCOM000183105D, IP.com PriorArtDatabase, 36 pages.

Jacobsson, U.S. Appl. No. 61/349,950, entitled "Production Method," filed May 31, 2010.

Ziegler, Göran, et al., U.S. Appl. No. 61/474,485, entitled "Pre Treated Powder," filed in the U.S. Patent and Trademark Office on Apr. 12, 2011.

Håkansson, Niclas, et al., U.S. Appl. No. 61/474,498, entitled "Powder Based Balancing Layer," filed in the U. S. Patent and Trademark Office on Apr. 12, 2011.

Ziegler, Goran et al. U.S. Appl. No. 12/976,213, entitled "Heat and Pressure Generated Design," filed in the U. S. Patent and Trademark Office on Dec. 22, 2010.

Ziegler, Goran et al. U.S. Appl. No. 12/976,329, entitled "Bright Coloured Surface Layer," filed in the U. S. Patent and Trademark Office on Dec. 22, 2010.

Ziegler, Goran et al. U.S. Appl. No. 12/976,350, entitled "Fibre Based Panels with a Decorative Wear Resistance Surface," filed in the U. S. Patent and Trademark Office on Dec. 22, 2010.

Lindgren, Kent et al. U.S. Appl. No. 12/976,478, entitled "Fibre Based Panels with a Decorative Wear Resistance Surface," filed in the U. S. Patent and Trademark Office on Dec. 22, 2010.

Pervan, Darko, et al., U.S. Appl. No. 13/084,974, entitled "Digitally Injected Designs in Powder Surfaces," filed in the U.S. Patent and Trademark Office on Apr. 12, 2011.

Pervan, Darko, et al., U.S. Appl. No. 13/693,979, entitled "Recycling of Laminate Floorings," filed in the U.S. Patent and Trademark Office on Dec. 4, 2012.

Ziegler, Göran, et al., U.S. Appl. No. 13/705,310, entitled "Fibre Based Panels with a Decorative Wear Resistance Surface," filed in the U.S. Patent and Trademark Office on Dec. 5, 2012.

Persson, Hans, et al., U.S. Appl. No. 61/485,930, entitled "Scattering," filed in the U.S. Patent and Trademark Office on May 13, 2011.

Persson, Hans, et al., U.S. Appl. No. 61/557,643, entitled "Scattering", filed in the U.S. Patent and Trademark Office on Nov. 9, 2011.

Håkansson, Niclas, et al., U.S. Appl. No. 61/557,734, entitled "Powder Based Balancing Layer" filed in the U.S. Patent and Trademark Office on Nov. 9, 2011.

International Search Report issued in PCT/SE2011/050446, Jul. 12, 2011, 5 pp., Swedish Patent Office, Stockholm, SE.

Parquet International, "Digital Printing is still an expensive process," Mar. 2008, cover page/pp. 78-79, www.parkettmagazin.com.

Floor Daily, "Shaw Laminates: Green by Design," Aug. 13, 2007, 1 pg, Dalton, GA.

Pervan, Darko, et al., U.S. Appl. No. 13/793,971, entitled "Wood Fibre Based Panels with a Thin Surface Layer," filed in the U.S. Patent and Trademark Office on Mar. 11, 2013.

Vetter, Georg, et al., U.S. Appl. No. 13/804,355, entitled "Method for Producing a Building Panel," filed in the U.S. Patent and Trademark Office on Mar. 14, 2013.

POWDER OVERLAY

CROSS REFERENCE TO RELATED APPLICATIONS

The present application claims the benefit of U.S. Provisional Application No. 61/323,463, filed on Apr. 13, 2010. The entire contents of U.S. Provisional Application No. 61/323,463 are hereby incorporated herein by reference.

TECHNICAL FIELD

The disclosure generally relates to the field of fibre-based panels with wear resistant surfaces for building panels, preferably floor panels. The disclosure relates to building panels with such wear resistance surface and to production methods to produce such panels.

FIELD OF APPLICATION

Embodiments of the present invention are particularly suitable for use in floating floors, which are formed of floor panels with a wood fibre core and a decorative wear resistant surface. The following description of technique, problems of known systems and objects and features of the invention will therefore, as a non-restrictive example, be aimed above all at this field of application and in particular at floorings which are similar to traditional floating wood fibre based laminate floorings. Embodiments of the invention do not exclude floors that are glued down to a sub floor.

It should be emphasized that embodiments of the invention can be used as a panel or as a surface layer, which is for example glued to a core. The disclosure can also be used in applications as for example wall panels, ceilings, and furniture components and similar. It could also be used in floorings with optional surface materials such as cork or wood, in order to improve wear and design properties

BACKGROUND

Wood fibre based direct pressed laminated flooring usually comprises a core of a 6-12 mm fibre board, a 0.2 mm thick upper decorative surface layer of laminate and a 0.1-0.2 mm thick lower balancing layer of laminate, plastic, paper or like material.

A laminate surface generally comprise two paper sheets, a 0.1 mm thick printed decorative paper and a transparent 0.05-0.1 mm thick overlay paper applied over the decorative paper and intended to protect the decorative paper from abrasion. The print on the decorative non-transparent paper is only some 0.01 mm thick. The transparent overlay, which is made of refined fibres (e.g. α-cellulose fibres), comprises small hard and transparent aluminium oxide particles. The refined fibres are rather long, about 2-5 mm and this gives the overlay paper the required strength. In order to obtain the transparency, all natural resins that are present in the virgin wood fibres, have been removed and the aluminium oxide particles are applies as a very thin layer over the decorative paper. The surface layer of a laminate floor is characterized in that the decorative and wear properties are generally obtained with two separate layers one over the other.

The printed decorative paper and the overlay are impregnated with melamine resin and laminated to a wood fibre based core under heat and pressure.

The small aluminium oxide particles could have a size in the range of 20-100 microns. The particles could be incorporated in the surface layer in several ways. For example they could be incorporated in the pulp during the manufacturing of the overlay paper. They could also be sprinkled on the wet lacquer during impregnation procedure of the overlay or incorporated in the lacquer used for impregnation of the overlay.

The wear layer could also be produced without a cellulose overlay. In such a case melamine resin and aluminium oxide particles are applied as a lacquered layer directly on the decorative paper with similar methods as described above. Such a wear layer is generally referred to as liquid overlay.

With this production method a very wear resistant surface could be obtained and this type of surface is mainly used in laminate floorings but it could also be used in furniture components and similar applications. High quality laminate floorings have a wear resistance of 4000-6000 revolutions, which corresponds to the abrasion classes AC4 and AC5 measured with a Taber Abraser according to ISO-standard.

It is also known that the wear resistance of a lacquered wood surface could be improved considerably by incorporating aluminium oxide particles in the transparent lacquer covering the wood surface.

The most common core material used in laminate floorings is fibreboard with high density and good stability usually called HDF—High Density Fibreboard. Sometimes also MDF—Medium Density Fibreboard—is used as core. Other core materials such as particleboard are also used.

Recently new "paper free" floor types have been developed where powder technology is used to obtain a solid laminate surface comprises a substantially homogenous mix of non-processed wood fibres, binders and wear resistant particles. Such floor types are below referred to as "solid laminate" floors. The wear resistant particles are preferably aluminium oxide particles and the binders are preferably thermosetting resins such as melamine. Other suitable materials are for example silica or silicon carbide. In general all these materials are preferably applied in dry form as a mixed powder on a HDF core and cured under heat and pressure to a 0.2-1.0 mm solid (opaque) laminate layer. The solid layer in solid laminate floors provides high impact and wears resistance.

Powder technology is also used to produce floors with a surface that combines the paper technology and powder technology. Such floor types are below referred to as "wood powder laminate floors" A decorative paper is applied on a sub layer comprising wood powder and binders. The decorative paper is protected by a conventional overlay. The main advantages with such floors are that deep embossing and improved impact resistance could be obtained.

The wear resistance in wood powder laminate floors is generally not sufficient when surfaces with deep embossing is formed since the protruding parts at the surface are subject to high wear. Even some solid laminate floor with several thin layers comprising different colours suffer from a low wear resistance.

It would be a great advantage if wear resistance could be improved in a cost efficient way.

The above description of various known aspects is the applicants' characterization of such, and is not an admission that any of the above description is prior art.

DEFINITION OF SOME TERMS

In the following text, the visible surface of the installed floor panel is called "front side", while the opposite side of the floor panel, facing the sub floor, is called "rear side". The sheet-shaped material that comprises the major part of a panel and provides the panel with the required stability is called "core". When the core is coated with a surface layer closest to the front side and preferably also a balancing layer closest to the rear side, it forms a semi-manufacture, which is called "floor board" or "floor element" in the case where the semi-manufacture, in a subsequent operation, is divided into a plurality of floor elements. When the floor elements are machined along their edges so as to obtain their final shape with the joint system, they are called "floor panels". By "surface layer" are meant all layers which give the panel its decorative properties and its wear resistance and which are applied to the core closest to the front side covering preferably the entire front side of the floorboard. By "decorative surface layer" is meant a layer, which is mainly intended to give the floor its decorative appearance. "Wear layer" relates to a layer, which is mainly adapted to improve the durability of the front side.

By "horizontal plane" is meant a plane, which extends parallel to the outer part of the surface layer. By "horizontally" is meant parallel to the horizontal plane and by "vertically" is meant perpendicularly to the horizontal plane. By "up" is meant towards the front side and by "down" towards the rear side.

By processed wood fibres, are meant wood fibres that are processed, e.g. by removing natural resins such as lignin, such that they are transparent in a cured binder.

KNOWN TECHNIQUE AND PROBLEMS THEREOF

In laminate floors the wear and abrasion resistance is typically provided by aluminium oxide containing overlay papers that are impregnated and/or coated as for example described in U.S. 2009/0208646 A1. It also known to provide an overlay by applying a liquid layer of a resin e.g. a melamine resin into which aluminium oxide is applied. This type may also be reinforced by adding e.g. a cellulosic flock in liquid layer. It is also known to produce an overlay paper by adding the aluminium oxide in the paper production process.

The application of such an overlay paper or liquid layers is complicated and costly and it would be an advantage if the production method could be simplified. In addition, in deeply embossed products the wear properties are limited since the protruding parts of the surface are subjected to a higher stress than would be the case for more moderately embossed surfaces.

The recently developed class of paper free laminate floors can typically be made with superior wear properties, but in certain formulations superficial design elements, prints or other effects could need a surface protection exceeding what could be achieved through the normal formulation.

It is known that dry and wet overlays, which are produced by production methods where for example thermosetting resins in dry or wet form are mixed with aluminium oxide, without any fibres could also be used. Aluminium oxide particles mixed with melamine resin powder could for example be applied on a wood veneer prior to pressing and a wear resistant surface could be obtained without any surface coating after pressing. Such a production method does not give sufficient wear properties.

OBJECTS AND SUMMARY

An objective of certain embodiments of the invention is to provide a building panel, preferably a floor panel with a transparent wear resistant layer, which could be produced in a more cost effective way than with the present know technology, A second objective of certain embodiments is to provide a building panel, preferably a floor panel with a transparent wear resistant layer which can be used to make deeply embossed floor products with higher wear resistance than possible with presently known technology.

A third objective of certain embodiments is to provide a building panel, preferably a floor panel with a transparent wear resistant layer which allows for making floors having a better worn surface appearance.

A fourth objective of certain embodiments is to provide a formulation suited for application with scattering machines that can yield any or all of the objectives stated above.

The embodiments of the invention are not limited to the above objectives.

An aspect of the invention is a production method to produce a building panel with decorative surface layer with a transparent wear resistant surface layer comprising the steps below and preferably in the indicated sequence:

applying a decorative layer on a carrier;

applying a dry powder layer comprising a mix of processed wood fibres, binder and wear resistant particles on the decorative layer; and curing the mix by applying heat and pressure to obtain a decorative surface layer comprising a transparent wear resistant layer.

The powder is easy to handle and provides a cost efficient production method. The processed wood fibres provide, together with the cured binder, a reinforced matrix for the wear resistant particles which are essentially homogenously distributed throughout the thickness of the cured layer. This matrix prevents the wear resistant particles from coming off during wear of the surface layer and combined with the essentially homogenously distribution a significant increased wear resistance is achieved.

In an embodiment, the powder mix may comprise processed wood fibres in the range of about 1% to about 50%, preferably about 20%, by weight of the powder mix, binder in the range of about 50% to about 90%, preferably about 70%, by weight of the powder mix, and wear resistant particles in the range of about 0% to about 15%, preferably about 10%, by weight of the powder mix.

The curing is preferably performed by applying the heat and pressure by, for example, press plates, during about 5-200 seconds, preferably during 5-30 seconds. The heat applied may be in the range of about 140° C. to about 200° C., preferably in the range about 160 to about 180° C. The pressure applied is in the range of about 20 to about 60 kg/cm2, preferably about 40 kg/cm2.

The binder is preferably melamine formaldehyde resin and the wear resistant particles are preferably aluminium oxide or silica. The wear resistant layer is according to one preferred embodiment pressed with an embossed matrix that forms protruding parts on the surface.

The dry powder comprises according to one embodiment processed wood fibres that are essentially all small individual fibres which may be smaller than about 1.0 mm, preferably smaller than 0.5 mm. The small fibres are preferably not bonded to each other as for example long fibres in paper layers and a HDF core, and can be compressed, formed and displaced in all direction during the initial part of a pressing operation until the binder cures. The uncured transparent wear layer preferably behaves similar to a paste or a liquid substance and floats during the initial part of the curing stage.

The fiber size may be measured in different ways:
An actual individual fiber could be measured in diameter and length.
A fiber size could be defined by the size of the mesh of the net in the sieve in which the fibers are separated by size and the wanted fraction is sorted out.

For refined fibers used in a wood fiber floor produced from an hdf-board the typical production steps are:
bringing down the hdf-boards to flakes in a pre mill;
bringing down the flakes to the wanted size in a hammer mill;
sieving the fibers in a net with a mesh size of 0.3 mm. Often such fibers are defined to be less than 0.3 mm in size. The diameter could though of course be less and the length could be longer due to the elongated shape of the fiber.

The distribution of the fiber sizes after sieving could be defined by measurements of the fibers.

For processed fibers (for example, bleached fibers) the mesh size used is often smaller than the one for refined fibers. The size of the fibers is defined by the distribution of the sieved material. A typical distribution of fibers size is:
>32 µm 43.6%
>90 µm 9.3%
>160 µm 0.4%

The powder mix and the curing can be adapted such that a larger amount of wear resistant and transparent material is located in the upper parts of the protruding surface portions than on the lower and more compressed portions. This will give a higher wear resistance in the parts that are subject to the highest wear.

The decorative layer may include, for example, paper. The paper may be a printed melamine impregnated paper, for example, a décor sheet composed of melamine resin impregnated cellulose fibres. The paper may be placed directly on the carrier, for example, an HDF board. The paper may be placed on a scattering of decorative powder mix. For example, the decorative powder may include wood fibres and a binder, and optionally, a pigment and/or wear resistant particles. The wood fibres of the decorative power may be processed wood fibres or unprocessed wood fibres, such as recycled wood fibres.

The decorative layer may include, for example, a scattering of decorative powder mix. For example, the decorative powder may include wood fibres and a binder, and optionally, a pigment and/or wear resistant particles. The wood fibres of the decorative power may be processed wood fibres or unprocessed wood fibres, such as recycled wood fibres. The decorative layer may include, for example, multiple layers of scattered decorative powder mix.

The decorative layer may include, for example, a wood veneer. The wood veneer may be placed directly on the carrier, for example, an HDF board. The wood veneer may be placed on a scattering of decorative powder mix. For example, the decorative powder may include wood fibres and a binder, and optionally, a pigment and/or wear resistant particles. The wood fibres of the decorative power may be processed wood fibres or unprocessed wood fibres, such as recycled wood fibres.

The decorative layer may include, for example, cork. The cork may be placed directly on the carrier, for example, an HDF board. The cork may be placed on a scattering of decorative powder mix. For example, the decorative powder may include wood fibres and a binder, and optionally, a pigment and/or wear resistant particles. The wood fibres of the decorative power may be processed wood fibres or unprocessed wood fibres, such as recycled wood fibres.

A second aspect of the invention is a method of manufacturing a building panel, wherein the method comprises the steps of:
applying a decorative layer on a carrier;
applying a dry powder layer comprising a mix of a thermoplastic material and wear resistant particles on the decorative layer; and
applying heat and pressure on the powder layer to obtain a decorative surface layer comprising a transparent wear resistant layer.

The wear resistant particles may comprise aluminium oxide and/or silica. The mix may include processed wood fibres.

A third aspect of the invention is a method of manufacturing a building panel, wherein the method comprises the steps of:
applying a dry powder layer comprising a mix of processed wood fibres, binder and wear resistant particles directly on a wood panel; and
applying heat and pressure on the powder layer to obtain a transparent wear resistant layer.

The resulting product is, for example, a clear and glossy wood product having excellent chemical and abrasion resistance.

The wear resistant particles may comprise aluminium oxide and/or silica. The binder may comprise a thermoplastic material.

The thermoplastic material in the second and third aspect may be transparent material such as vinyl particles. Several plastic materials in powder form can be used such as E-PVC, S-PVC, PVA, PET, PS, SAN, PMMA and similar.

The plastic powder should preferably have a glass transition temperature below the intended processing temperature and a melting point higher than the intended processing temperature. The plastic can further comprise functional groups such as hydroxy-, carboxy- and amino functionalities. Blends of plastics can also be used.

BRIEF DESCRIPTION OF THE DRAWINGS

The invention will in the following be described in connection to preferred embodiments and in greater detail with reference to the appended exemplary drawings, wherein.

DETAILED DESCRIPTION OF EMBODIMENTS

Figure 1:
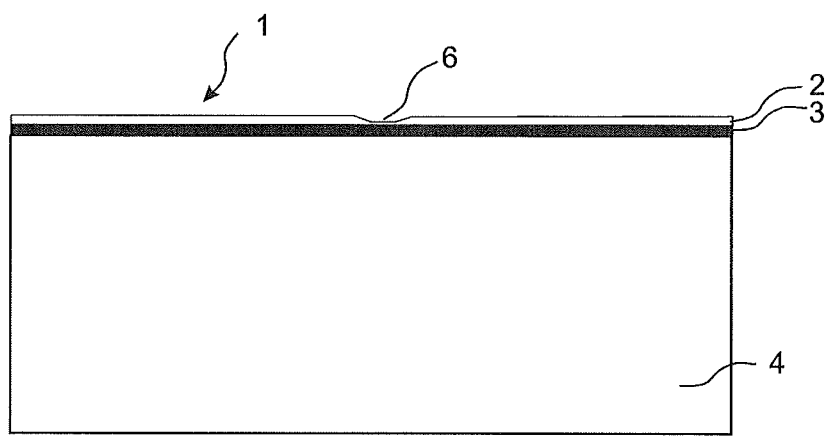
FIG. 1 illustrates a conventional laminate floor panel with an embossed portion.

A laminate floor having good mechanical wear properties are made from the application of heat and pressure to layers of various types of sheets of papers over which a powder layer is scattered. The sheets are positioned over a core, such as a medium or high density fibre board. Under the core one or more sheets of paper can be positioned. The sheets are made using standard papermaking techniques and chemistry and are typically impregnated using standard impregnation techniques and chemistry. In an embodiment the powder layer is composed of a homogenous mixture of powder resin, fibres and hard particles. The powder resin is preferably a thermoset resin such as amino resin or a mixture of such resins. A preferred resin is melamine formaldehyde resin. The fibres are preferably transparent such as processed wood fibres but also other transparent fibres such as glass fibres can be used. Fibres having limited transparency such as various inorganic fibres, metal fibres or unprocessed wood fibres can be used but would not yield the desired transparency of the protective layer. Preferred hard particles to yield the final good mechanical wear properties include aluminium oxide, silicon oxide and mixtures thereof. The use of heat and pressure convert the layers of sheets and the scattered powder layer into a laminate A typical laminate floor (FIG. 1) is composed from top and bottom with the following layers: (2) an overlay sheet composed of melamine resin impregnated cellulose fibres in which abrasive particles are incorporated, (3) a décor sheet composed of melamine resin impregnated cellulose fibres, (4) a core material such as high density fibre board. A balancing sheet composed of melamine resin impregnated cellulose fibres is typically used on the backside of the panel. A laminate floor typically has embossed portions (6) extending below the main surface (1). If the embossed portions extend to far from the main surface poor surface appearance can occur due to the limitation of the impregnated papers.

Figure 2:
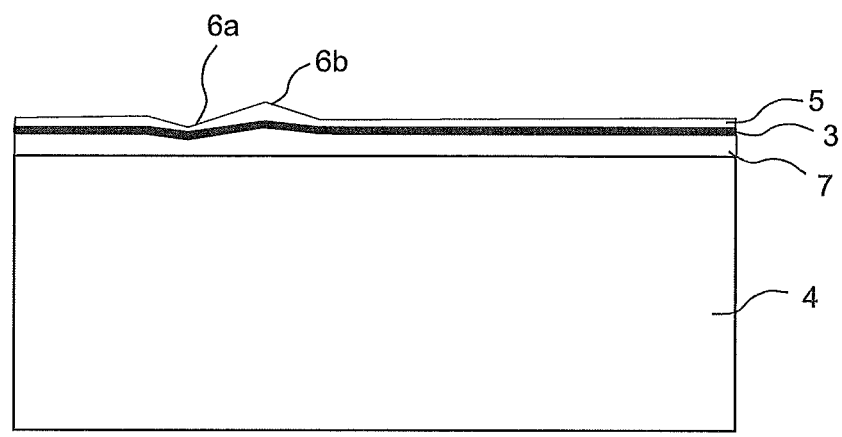
FIG. 2 illustrates an improved laminate floor with embossed portions.

An improved laminate floor (FIG. 2) according to one non restrictive embodiment of the invention comprises from top to bottom the following layers: (5) a protective powder layer, powder overlay, composed of melamine resin powder, processed wood fibres and abrasive particles, (3) a décor sheet composed of melamine resin impregnated cellulose fibres, (7) an optional powder layer comprising of melamine resin powder and processed wood fibres, (4) a core material such as high density fibre board. A balancing sheet composed of melamine resin impregnated cellulose fibres is typically used. Since the protective powder layer does not have a restricted movement in neither horizontal nor vertical directions embossed potions can be found both below (6a) and above (6b) the main surface (1). The resulting products have a higher amount of the protective melamine resins and aluminium oxide particles in the protruding surface portion (6b) giving an improved wear resistance compared to what is found with conventional overlays.

The impregnation of overlay papers are typically made in impregnation lines such as for example described in U.S. 2009/0208646 A1. Such impregnation lines require investments and handling of impregnation fluids that typically have limited shelf life. Such a process could be improved by the use of a powder overlay.

Example 1

Direct Laminate Product Having a Conventional Overlay (Comparative Example)

A laminate product comprising a HDF carrier board, a balancing paper, a printed melamine impregnated paper and an overlay was pressed in a short cycle press using a force of 40 kg/cm2 for 25 seconds at a surface temperature of 160° C. The press plate was a virtually smooth glossy plate.

The resulting product was a laminated surface having an abrasion resistance exceeding the demands for AC3 according to the test method in EN13329:2006 (E) with a good surface appearance.

Example 2

Deeply Embossed Laminate Product Having a Conventional Overlay (Comparative Example)

A laminate product comprising a HDF carrier board, a balancing paper, a printed melamine impregnated paper and an overlay was pressed in a short cycle press using a force of 401 g/cm2 for 25 seconds at a surface temperature of 160° C. The press plate was a deeply structured plate with parts having 0.7 mm depth.

The resulting product was a laminated surface having an abrasion resistance failing the demands for AC2 according to the test method in EN13329:2006 (E). In addition the surface appearance was not good enough since the paper sheets of the laminate cracked at the large embossings.

Example 3

Deeply Embossed Direct Laminate Product Having a Protective Layer Made with Regular Fibres (Comparative Example)

A laminate product comprising a HDF carrier board, a balancing paper, a printed melamine impregnated paper and 300 g/m2 of a protective layer comprising a homogenous mixture of recycled fibres that have not been processed, melamine powder resins and aluminium oxide particles was pressed in a short cycle press using a force of 40 kg/cm2 for 25 seconds at a surface temperature of 160° C. The press plate was a virtually smooth press plate.

The resulting product was a laminated surface having an abrasion resistance passing the demands for AC6 according to the test method in EN13329:2006 (E). The surface appearance was not good enough since the fibres in the protective layer were visible.

Example 4

Deeply Embossed Direct Laminate Having a Protective Layer as per an Embodiment of the Disclosure A laminate product comprising a HDF carrier board, a balancing paper positioned under the HDF, 1000 g/m2 of a scattered sub layer comprising a homogenous mixture of recycled fibres and amino resins, scattered over the HDF, a melamine resins impregnated printed paper positioned over the scatted sub layer and 300 g/m2 of a protective layer comprising a homogenous mixture of processed fibres, melamine powder resins and aluminium oxide particles, scattered over the printed melamine impregnated paper, was pressed in a short cycle press using a force of 40 kg/cm2 for 25 seconds at a surface temperature of 160° C. The press plate was a deeply structured plate with parts having 0.7 mm depth.

The resulting product was a laminated surface having an abrasion resistance passing the demands for AC3 according to the test method in EN13329:2006 (E). The surface appearance was good enough since the fibres in the protective layer was not visible and no cracks of overlay paper were found in the deep embossed parts of the surface.

Example 5

Deeply Embossed Paper Free Building Panel Having a Protective Layer as per an Embodiment of the Disclosure 150 g/m2 of a protective layer comprising a homogenous mixture of processed fibres, melamine powder resins and aluminium oxide particles, scattered over 150 g/m2 of a decorative layer comprising a homogenous mixture of processed fibres, melamine powder resins, pigment particles and aluminium oxide particles, scattered over 500 g/m2 of a second decorative layer comprising a homogenous mixture of processed fibres, melamine powder resins, pigment particles and aluminium oxide particles was pressed in a short cycle press using a force of 40 kg/cm2 for 25 seconds at a surface temperature of 160° C. The press plate was a deeply structured plate with parts having 0.7 mm depth.

The resulting product was a deeply structured paper free laminate having an abrasion resistance passing the demands for AC6 according to the test method in EN13329:2006 (E).

The initial surface appearance was excellent since the protective layer protects the surface from micro scratches that typically give products an early worn appearance.

Example 6

Wood Panel Having a Protective Layer as per an Embodiment of the Disclosure

A sanded wood panel was scattered with 150 g/m2 of a protective layer comprising a homogenous mixture of processed fibres, melamine powder resins and aluminium oxide particles. The product was compressed at 20 bars for 30 seconds at 160° C. using a smooth glossy press plate.

The resulting product was a clear glossy wood product having excellent chemical and abrasion resistance.

The invention claimed is:

1. A method of manufacturing a building panel, wherein the method comprises the steps of:
   applying a decorative layer on a carrier;
   applying a dry powder layer, comprising a mix of processed wood fibres, binder and wear resistant particles, on the decorative layer; and
   curing the mix by applying heat and pressure to obtain a decorative surface layer comprising a transparent wear resistant layer.

2. The method as claimed in claim 1, wherein the panel is a floor panel.

3. The method as claimed in claim 1, wherein the carrier is a wood based board.

4. The method as claimed in claim 1, wherein the carrier is an HDF or MDF board.

5. The method as claimed in claim 1, wherein the wear resistant particles are aluminium oxide.

6. The method as claimed in claim 1, wherein the decorative layer is a printed paper.

7. The method as claimed in claim 1, wherein the curing step comprises pressing the mix against an embossed matrix.

8. The method as claimed in claim 7, wherein the pressing against the embossed matrix creates an embossing depth that exceeds a thickness of the decorative layer.

9. The method as claimed in claim 7, wherein the pressing against the embossed matrix creates an embossing depth that exceeds the combined thickness of the decorative layer and the transparent wear layer.

10. A method of manufacturing a building panel, wherein the method comprises the steps of:
    applying a decorative layer on a carrier, wherein the decorative layer comprises a transparent paper based overlay comprising aluminium oxide;
    applying a dry powder layer, comprising a mix of processed wood fibres, binder and wear resistant particles, on the decorative layer; and
    curing the mix by applying heat and pressure to obtain a decorative surface layer comprising a transparent wear resistant layer.

11. A method of manufacturing a building panel, wherein the method comprises the steps of:
    applying a decorative layer on a carrier, wherein the decorative layer comprises a transparent paper based overlay comprising aluminium oxide applied over a lower dry powder layer, the lower dry powder layer comprising wood fibres and a binder;
    applying a dry powder layer, comprising a mix of processed wood fibres, binder and wear resistant particles, on the decorative layer; and
    curing the mix by applying heat and pressure to obtain a decorative surface layer comprising a transparent wear resistant layer.

12. The method as claimed in claim 1, wherein the processed wood fibres are essentially all smaller than 1.0 mm.

13. The method as claimed in claim 1, wherein the processed wood fibres are essentially all smaller than 0.5 mm.

14. The method as claimed in claim 1, wherein the heat and pressure is applied for 5-200 seconds.

15. The method as claimed in claim 1, wherein the heat and pressure is applied for 5-30 seconds.

16. The method as claimed in claim 1, wherein the heat applied is in the range of about 140° C. to about 200° C.

17. The method as claimed in claim 1, wherein the pressure applied is in the range of about 20 to about 60 kg/cm2.

18. The method as claimed in claim 1, wherein the thickness of the transparent surface layer exceeds the thickness of the decorative layer.

19. The method as claimed in claim 1, wherein the decorative surface layer is embossed and the thickness of the transparent surface layer varies such that the thickness in an upper portion exceeds a thickness of a lower portion.

20. The method as claimed in claim 1, wherein the heat and pressure is applied for 5-30 seconds, the heat applied is in the range of about 140° C. to about 200° C., and the pressure applied is in the range of about 20 to about 60 kg/cm2.

21. The method as claimed in claim 1, wherein the decorative layer is applied on the carrier before the dry powder layer is applied on the decorative layer.

* * * * *